United States Patent
Schultz et al.

(10) Patent No.: US 12,356,513 B2
(45) Date of Patent: Jul. 8, 2025

(54) WARMING WRAP FOR COLD WEATHER OUTDOOR EQUIPMENT

(71) Applicant: Affinitrix, LLC, Plymouth, MN (US)

(72) Inventors: William David Schultz, Plymouth, MN (US); William Daniel Schultz, Plymouth, MN (US)

(73) Assignee: Affinitrix, LLC, Plymouth, MN (US)

( * ) Notice: Subject to any disclaimer, the term of this patent is extended or adjusted under 35 U.S.C. 154(b) by 0 days.

(21) Appl. No.: 18/130,268

(22) Filed: Apr. 3, 2023

(65) Prior Publication Data
US 2023/0239971 A1   Jul. 27, 2023

Related U.S. Application Data

(62) Division of application No. 16/395,011, filed on Apr. 25, 2019, now abandoned.
(Continued)

(51) Int. Cl.
*H05B 3/34* (2006.01)
*A63C 11/22* (2006.01)
(Continued)

(52) U.S. Cl.
CPC ............ *H05B 3/34* (2013.01); *H01R 31/065* (2013.01); *H05K 5/0086* (2013.01); *H05K 5/0213* (2013.01); *A63C 11/228* (2013.01)

(58) Field of Classification Search
CPC ...... H05B 1/0252; H05B 3/34; H05K 5/0213; H05K 5/0086
See application file for complete search history.

(56) References Cited

U.S. PATENT DOCUMENTS

| 2,997,042 A | 8/1961 | Mitchell |
|---|---|---|
| 3,980,070 A | 9/1976 | Krupa |

(Continued)

FOREIGN PATENT DOCUMENTS

| CN | 205585516 U | * | 9/2016 |
|---|---|---|---|
| CN | 206434830 U | | 8/2017 |

(Continued)

OTHER PUBLICATIONS

Pang et al., "Flexible and Stretchable Biobatteries: Monolithic Integration of Membrand-Free Microbial Fuel Cells in a Single Textile Layer" published on Nov. 6, 2017, 8pgs. Available at: https://onlinelibrary.wiley.com/doi/full/10.1002/aenm.201702261.
(Continued)

*Primary Examiner* — Thien S Tran
(74) *Attorney, Agent, or Firm* — Merchant & Gould P.C.

(57) ABSTRACT

A system and method for providing warmth to a person, particularly a skier, in cold or inclement outdoor elements. Skiing is an outdoor winter sport where participants need to have proper clothing and equipment to stay warm in order to participate at optimal strength. Traveling on open-air lifts may cause skiers to become cold. The present disclosure provides a warming wrap that may be placed on a ski pole or other handheld device. A heating device integrated in the warming wrap transmits warmth through an outer layer whereas an insulating layer limits heat from escaping into the pole. The warming wrap contains a heating device that transmits heat from the heating layer to a person who touches the outer layer of the warming wrap. A grip layer alone or together with a fastener arrangement prevents the wrap from sliding down the pole. The preferred placement of the wrap on the pole rather than on a grip or in a glove or mitten provides the skier with better control and balance of the ski pole.

22 Claims, 13 Drawing Sheets

Related U.S. Application Data

(60) Provisional application No. 62/662,901, filed on Apr. 26, 2018.

(51) Int. Cl.
  *H01R 31/06* (2006.01)
  *H05K 5/00* (2025.01)
  *H05K 5/02* (2006.01)

(56) References Cited

U.S. PATENT DOCUMENTS

| | | | |
|---|---|---|---|
| 4,077,390 | A | 3/1978 | Stanley et al. |
| 4,366,804 | A | 1/1983 | Abe |
| 4,440,421 | A | 4/1984 | Adamson |
| 4,649,895 | A | 3/1987 | Yasuki et al. |
| 4,880,953 | A | 11/1989 | Manker |
| 5,046,479 | A | 9/1991 | Usui |
| 5,246,518 | A | 9/1993 | Hale |
| 5,375,263 | A | 12/1994 | Cuccia |
| 5,545,197 | A | 8/1996 | Bowen |
| 5,645,749 | A | 7/1997 | Wang |
| 5,928,275 | A | 7/1999 | Yates et al. |
| 6,425,494 | B1 | 7/2002 | Woods |
| 6,427,678 | B1 * | 8/2002 | Trzeciak ............... A01K 87/085 43/25 |
| 6,727,467 | B1 | 4/2004 | Hadzizukic et al. |
| 6,886,553 | B2 | 5/2005 | Yim |
| 7,347,019 | B1 | 3/2008 | Shaw |
| 2002/0071939 | A1 | 6/2002 | Tomiyasu et al. |
| 2003/0061659 | A1 * | 4/2003 | Dunlap ................. A47G 9/066 5/485 |
| 2007/0256677 | A1 | 11/2007 | Yim et al. |
| 2007/0256678 | A1 | 11/2007 | Yim et al. |
| 2007/0256679 | A1 | 11/2007 | Yim et al. |
| 2008/0147152 | A1 * | 6/2008 | Quincy ..................... A61F 7/03 607/114 |
| 2008/0272104 | A1 | 11/2008 | Farrington |
| 2009/0242539 | A1 | 10/2009 | Wassel |
| 2012/0061371 | A1 | 3/2012 | Broom |
| 2014/0274614 | A1 | 9/2014 | Newman et al. |
| 2017/0164512 | A1 * | 6/2017 | Coulter ................. G06F 1/1656 |
| 2017/0352928 | A1 * | 12/2017 | Lingenfelter ....... H01M 50/247 |
| 2019/0168946 | A1 | 6/2019 | Walsh |

FOREIGN PATENT DOCUMENTS

| | | |
|---|---|---|
| RU | 2625089 C1 | 7/2017 |
| WO | 2014107840 A1 | 7/2014 |

OTHER PUBLICATIONS

Binghamton University, "Scientists create stretchable battery made entirely out of fabric: New microbial fuel cell could be integrated into wearable electronics." ScienceDaily, Dec. 7, 2017, 2pgs. Available at: https://www.sciencedaily.com/releases/2017/12/171207114948.htm.

R&D World "New Stretchable Battery Made From Fabric" Dec. 7, 2017, 3pgs. Available at: https://www.rdworldonline.com/new-stretchable-battery-made-from-fabric/.

Nanotechnology World Association, "Stretchable battery made entirely out of fabric" Dec. 10, 2017 Available at: https://www.youtube.com/watch?v=gnQ3zW63KIA.

Newsweek "Technology You Can Wear: New Stretchy Bio-Battery Could Be Powered by Your Sweaty Gym Socks" Dec. 9, 2017, 3pgs Available at: http://www.newsweek.com/need-charge-no-sweat-fabric-doubles-bio-battery-742364.

Poplular Mechanics "Fabric That Doubles as a Battery" Jan. 11, 2011, 2pgs. Available at: https://www.popularmechanics.com/science/energy/a6532/fabric-that-doubles-as-a-battery/.

* cited by examiner

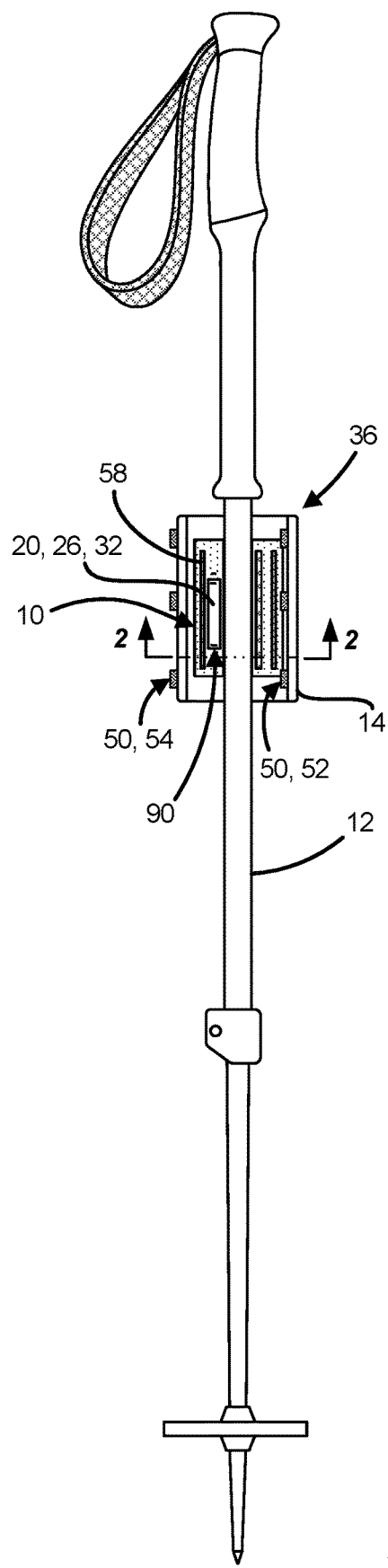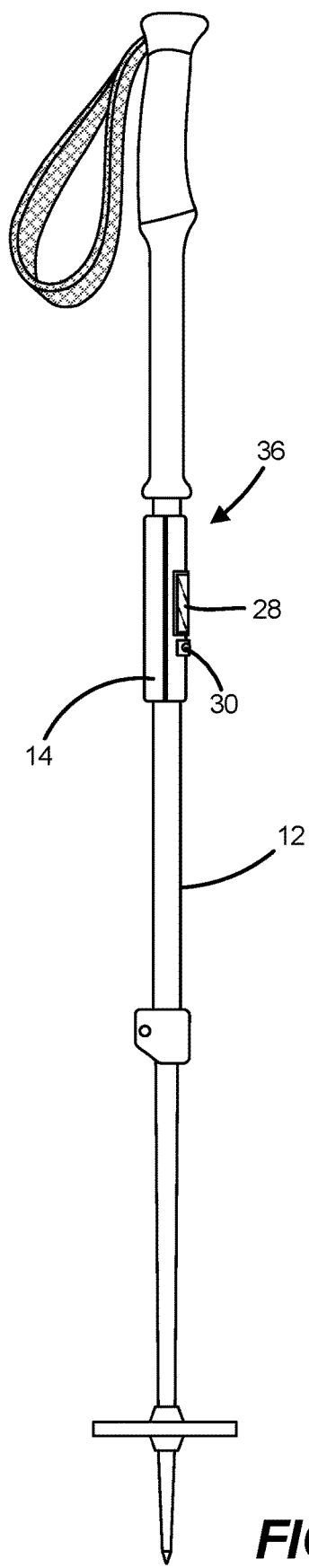
*FIG. 1A*  *FIG. 1B*

WARMING WRAP FOR COLD WEATHER OUTDOOR EQUIPMENT

This application is a divisional application of application Ser. No. 16/395,011, filed Apr. 25, 2019, which claims priority to Provisional Ser. No. 62/662,901, filed Apr. 26, 2018, which applications are incorporated herein by reference in their entireties.

1. TECHNICAL FIELD

The present disclosure relates to heating devices used in connection with outdoor sporting equipment and cold weather products.

2. BACKGROUND

Skiing is a winter sport that requires proper clothing to keep skiers warm and dry to enable their best performance. Skiers and the manufacturers of ski equipment have for years attempted to provide warming devices to maintain skiers' body heat, particularly in their hands.

One group of improvements in the ski industry included the use of chemical heating devices that emit heat when exposed to oxygen. An example of such chemical hand warmer is the brand HotHands. These chemical hand warmers are designed to be placed inside a skier's gloves or mittens. Upon exposure to air, the hand warmer is activated and heats up to 130 degrees, depending on the manufacturer. A draw back to chemical hand warmers, however, is that the heat source may only last minutes or hours, depending on the quality of the hand warmer. Upon exposure to the air, the chemical hand warmers also harden. These chemical hand warmers, particularly when they are placed directly inside the glove or mitten, may cause irritation when placed directly on the skin. Skiers also have no ability to regulate the temperature of the chemical hand warmer. The chemical-based hand warming products are for one-time use.

The ski industry attempted to improve upon chemical hand warmers by creating pockets in gloves and mittens. With this advancement, the chemical hand warmer was no longer placed directly onto the skier's skin. The other draw backs to the chemical hand warmer, however remain.

Another group of improvements include electronic heating devices that are placed directly into a skier's gloves or mittens. Such advancements, however, include the use of bulky battery packs and heating devices that are integrated into the gloves and mittens. The addition of these components adds to the weight and bulk of the gloves and mittens. This is contrary to the desires of skiers, who want to have equipment that is lightweight and flexible. These devices further do not provide for proper temperature regulation.

Yet another group of advancements integrated heaters directly into the ski pole grips. Such integration, however, alters the balance of the weight of a ski pole as the added weight of the battery, heating devices, and other components were placed at the extreme end of the ski pole. Further, the heated grips did not have proper temperature regulation. Many skiers do not want the added heat while they are skiing, opting rather to have the added heat only during periods when they are less active. The fully integrated heating devices in the grips of the skis, however, do not provide for proper temperature regulation while the skier is skiing. Too much heat causes the skier to sweat, which is counter productive to maintaining warmth.

Another group of advancements attempted to place a heating device in close proximity to, but not integrated with the grips of a ski pole. These advancements, however, expend a significant amount of heat to portions of the ski pole that do not reach the skier.

There is a need for a warming device that does not interfere with a skier's ability to enjoy the sport, while providing an additional benefit of providing the proper amount of warmth.

SUMMARY

The present disclosure relates to an attachable and detachable warming wrap system adapted to connect to handheld devices for warming appendages such as human hands. The system includes an outer layer, preferably made of a water proof or water resistant material that allows the transmission of heat through the material. A heater layer including a heating device is positioned within the warming wrap system. The heating layer with the heating device is a heat source that provides heat to and through the outer later such that a user of the handheld device may warm his or her hands or other appendages. The system includes an insulation layer that is position against the heating layer to prevent heat from the heating layer to escape instead of being transmitted to and through the outer layer. The heating layer is positioned between and against the outer layer and insulation layer. A fastener arrangement, such as a hook and loop system (e.g., Velcro), a slap-on device, or an edge wrap is used to removably fasten the warming wrap system to a handheld device such as a ski pole.

Another aspect of the warming wrap system is the makeup of the outer layer. In one embodiment, a fabric that is composed of material that is capable of being printed upon using sublimation printing is included. Fabrics such as polyester, nylon, Lycra, Spandex (elastane), other elastic fabrics, and other fabrics that can withstand high temperatures may be used in connection with sublimation printing. The marketing aspects of the warming wrap system may include corporate logos and other printed materials on the outer layer of the warming wrap system.

The heating device of the system can be an electronic heating device or a non-electronic heating device. Examples of electronic heating devices include battery operated heating coils, defroster line heaters, and heating pads, and other devices that rely on electricity to produce heat. Examples of non-electronic heating devices include mechanical, thermal, and chemical devices, examples of which include disposable hand warmers, toe warmers, foot warmers, body warmers, friction-producing devices, and other devices that do not rely on electricity to produce heat.

The fastener arrangement of the system can be various components such as hook and loop (Velcro); zippers; hooks and eye; frog fasteners; toggle fasteners; metal fasteners; grommets; eyelets; buttons; belts; and cords. The fastener arrangement may also be a slap-on device such as a slap band or self-curling metal, plastic, or other material. The fastener arrangement may also be an edge wrap made of fabric, elastic fabric, plastic, or other material that capable of fastening to a handheld device.

The warming wrap system may include an opening in the outer layer that permits access to a heating device chamber. A heating device may be inserted into the heating device chamber. The heating device chamber is positioned within the heating layer and may form the heating layer. A heating device may be inserted and removed from the heating device chamber through the opening in the outer layer. The heating device may be removable or replaceable from the warming wrap system.

An aspect of the warming wrap system includes a computer brain to control the level of heat produced by the heating layer. A battery may be connected to or contained within the same component as the brain. A switch may be connected to the computer brain to control the level of heat produced by the heating layer. An aspect of the warming wrap system may include a display to provide information regarding the system. The display may provide information including heat level, external temperature, snow temperature, snow reports, light condition, snow depth, time, geographic location, altitude, maps, trail reports, test reports, weather, advertisements, news updates, and ski lift information, among other information.

The system may have a beacon to transmit distress signals. The beacon may be an independent feature in the system or integrated with the computer brain or combination of the computer brain and battery. The transmission of distress signals can be done via a communications network or via direct communication with a mobile device.

The warming wrap can be used to warm an appendage by positioning a warming wrap around a handheld device and thereby permitting the user of the handheld device to feel warmth from the warming wrap. The warming wrap will include an outer layer, a heating layer, an insulation layer, a heating device to provide heat from the heating layer, and a fastener arrangement around a handheld device. The warming wrap may be fastened to the handheld device using a fastener arrangement. The user may place an appendage, such as a hand, on the outer layer of the warming wrap, wherein heat from the heating layer transmits through the outer layer to the appendage. The warming wrap may be placed on a handheld device such as a ski pole. The fastener arrangement may be a hook and loop system (e.g., Velcro), a slap-on device, or an edge wrap. These fastener arrangements may be used to removably fasten the warming wrap system to a handheld device such as a ski pole. One or more fastener arrangements may be used to removably fasten the warming wrap system to a handheld device. For example, a slap-on device may be used together with a hook and loop system to fasten the warming wrap to a handheld device such as a ski pole. A switch may be used to activate the heating layer to control a temperature of the heating layer. A user may also insert a heating device into a heating device chamber within the heating layer. A user may also use a switch to activate a display connected to the switch, the display providing information including one of more of: heat level, external temperature, snow temperature, snow reports, light condition, snow depth, time, geographic location, altitude, maps, trail reports, test reports, weather, advertisements, news updates, and ski lift information.

A handheld device may include a warming wrap that includes an outer layer, a heating layer that includes a heating device, an insulation layer, and a fastener arrangement to fasten the warming wrap to the handheld device. The insulation layer may be positioned against the heating layer. The heating layer may be positioned between and against the outer layer and the insulation layer. The fastener arrangement may be removable.

The present disclosure relates to an attachable and detachable warming wrap that may be placed on a desired location of a ski pole, preferably under the grip in a manner that does not alter the balance of the ski pole. The warming wrap comprises an outer wrap layer that includes a fastening mechanism such as Velcro, buttons, zippers, or other mechanism that enable the wrap to encircle the ski pole. A heating layer is incorporated under the outer layer that produces heat which may be transmitted from the warming element through the outer wrap layer and to the skier's appendages, such as hands, when grasped. An insulation layer is preferably placed between the heating layer and the ski pole to limit the loss of heat into the ski pole. A grip is included on an inside layer of the warming wrap to prevent the wrap from slipping outside the skier's desired location on the ski pole. A battery, which is preferably integrated into the insulation layer, powers the heating device and a computer brain. The computer brain maintains the desired temperature based on inputs from the skier, which preferably may be controlled via a display on the wrap, via an application on a phone or tablet, or a combination thereof. A switch enables the skier to turn the heating device on and off.

Another aspect of the present disclosure enables communication between the computer brain, described in the prior two embodiments, and an application, website, or other electronic interface. The computer brain is comprised of a transmission module, preferably cellular, Bluetooth, WiFi, satellite, radio, combination thereof or other communications protocol. The communications protocol transmits information to and from the computer brain to an application, website, or other electronic interface. Alternatively, the transmission may be to a cloud server that acts as an intermediary between the computer brain and the electronic interface. Alternatively, the transmission may be via a terrestrial transmission. A display connected to the computer brain provides details from the electronic interface. Alternatively, the computer brain sends details to the electronic interface and stores that information on a storage device, preferably a server. The display is preferably a touch screen with input options.

Another aspect of the present disclosure enables broadcast of communications from the computer brain to transmissions services. The computer brain includes a beacon that transmits signals. The transmission may emanate directly from the beacon to the transmission service or be alternatively sent to transmission services via an application, website, or other electronic interface. The computer brain includes a display.

Another aspect of the present disclosure integrates the warming wrap into a ski pole. Components of this aspect of the present disclosure comprise an outer layer that enables heat to transmit from a heating layer. An insulation layer is included to limit heat from being diverted into the ski pole. A battery, preferable rechargeable and removable, powers the heating device. A computer brain, which may be combined with the battery or separate, provides electronic signals to the heating device to increase or decrease the heat. A port comprises an inlet to connect the computer brain and battery with the heating device and a display. The display provides information preferably related to the heating controls of the computer brain, atmospheric conditions, snow temperature, lighting condition, outdoor temperature, weather alerts and information and other information related to ski conditions. A switch controls the power to the heating device and, preferably, the display.

Another aspect of the present disclosure integrates a slap-on feature to the wrap. Components of this aspect of the present disclosure comprise an outer layer that enables heat to transmit from a heating layer. The heating layer can include an electronic or non-electronic heating devices (or heating elements) or any other device that produces heat. Examples of electronic heating devices include battery operated heating coils, defroster line heaters, and heating pads, and other devices that rely on electricity to produce heat. Examples of non-electronic heating devices include mechanical, thermal, and chemical devices, examples of which include disposable hand warmers, toe warmers, foot warmers, body warmers, friction-producing devices, and other devices that do not rely on electricity to produce heat. An insulation layer is included to limit heat from being diverted away from the outer layer into the ski pole. For electronic heating devices operated by a battery, a battery, preferable rechargeable and removable, powers the heating device, of which there may be one or more heating devices. The electronic heating device may be connected to an internal or external source of energy. For non-electronic heating devices, the heating device may be self-contained or be connected to an external source of energy to produce heat. Non-electronic heating devices may also be used to convert energy into electronic energy. An insulation layer is included to limit heat from escaping from the device. A slap-on device, preferably integrated in the insulation layer, enables the wrap to be wrapped around the ski pole. An example of the slap-on device include snap bands that curl up upon being slapped onto an object. The slap-on device using snap bands provides the ability to flatten out the wrap in one state and a curled up wrap in a second state. A grip is included on an inside layer of the warming wrap to prevent the wrap from slipping outside the skier's desired location on the ski pole.

Another aspect of the present disclosure combines the features described in the above paragraphs with each other. Yet another aspect of the present disclosure combines the above-described features on non-ski related equipment. The wrap and its layers described above may accommodate different sized devices. For example, in the examples above, the wrap is preferably designed to wrap around a portion of or the entire diameter of a ski pole. Another aspect of the present disclosure is to increase or decrease the size of the wrap to enable the wrap to go on larger or smaller equipment. An example of larger equipment will include a snow shovel, which has a larger diameter than a ski pole. The size, including length and width, of the wrap and its components can be adjusted to fit the snow shovel. Use of different fastening devises with the wrap can also be employed depending on the type of device. In one aspect, the fastening device may be a hook and loop system (e.g., Velcro) whereby one of the wrap wraps around the equipment and is fastened on the other end (or portion thereof) of the wrap. The wrap may encircle the equipment partially, one time, or multiple times depending on the application. The outer wrap layer of the wrap may include a fastening mechanism such as Velcro, buttons, zippers, or other mechanism that enable the wrap to encircle the ski pole. In another aspect, the fastening device is embedded within or included on the wrap. For example, the grip layer may be composed of a sticky or tacky substance that adheres to the surface of the equipment, which may include tape and other adhesives. The aspect of the present disclosure that includes a slap-on device may come with or without a separate fastening device. The description of the separate layers herein is not a required aspect of the present disclosure in that the layers may be merged or separated based on the application or equipment at issue.

BRIEF DESCRIPTION OF THE DRAWINGS

Those skilled in the art will recognize features and advantages of the present disclosure upon a reading of the drawings and descriptions herein. While a current embodiment of the warming wrap and methods related thereto has been described in detail, it should be apparent to those skilled in the art that modifications and variations are possible, including variations in size, materials, shape, form, function, manner of operation, assembly and use. The following are illustrative and all suitable modifications and equivalents may fall within the scope of the present disclosure.

FIG. 1A is a side elevational view of a warming wrap system and internal features prior to placement on a ski pole.

FIG. 113 is a side elevational view of the warming wrap system of FIG. 1A and external features after placement on a ski pole.

DETAILED DESCRIPTION

Figure 2:
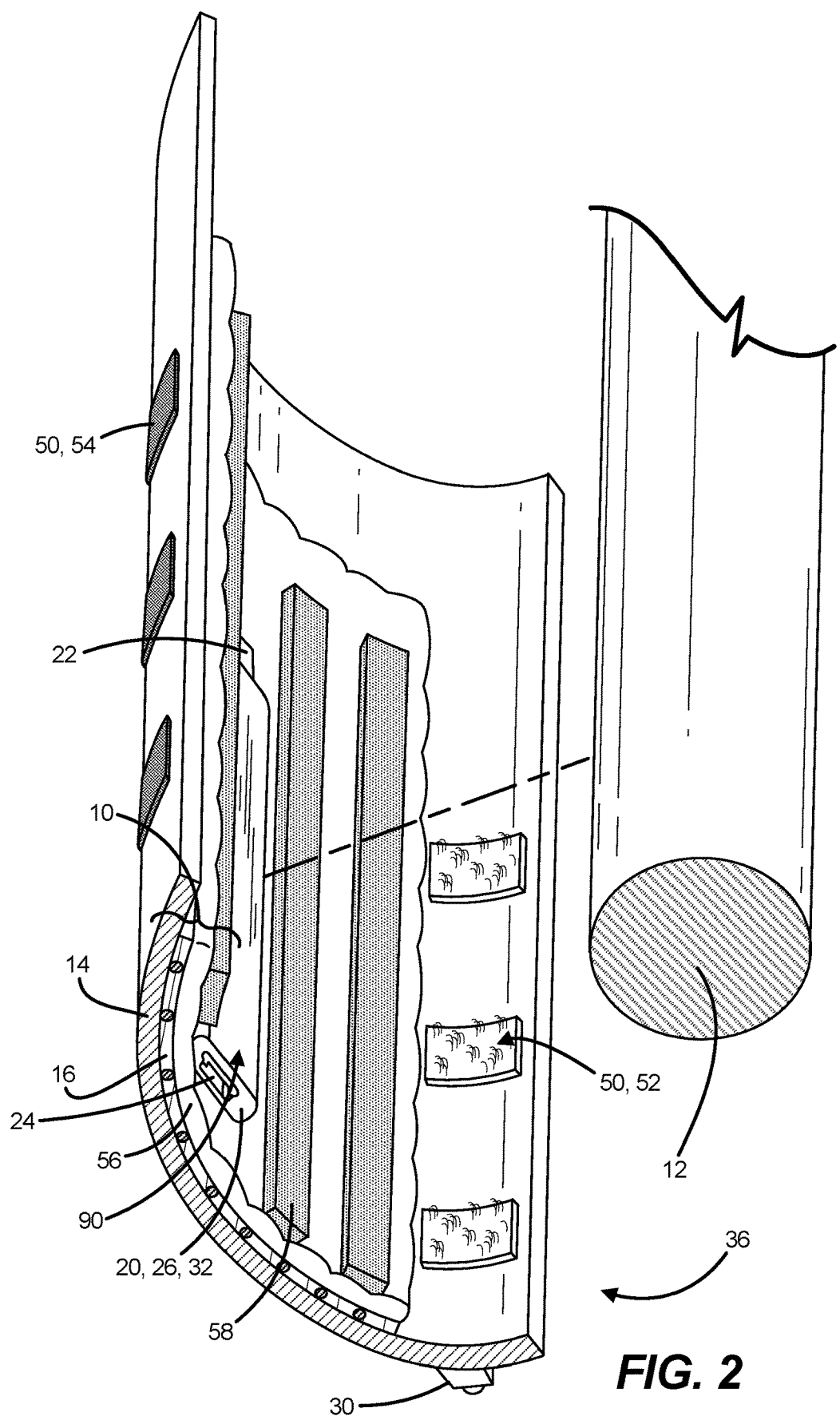
FIG. 2 is a perspective view of components of a warming wrap system and a preferable relationship of the internal components of the warming wrap system.
Figure 3:
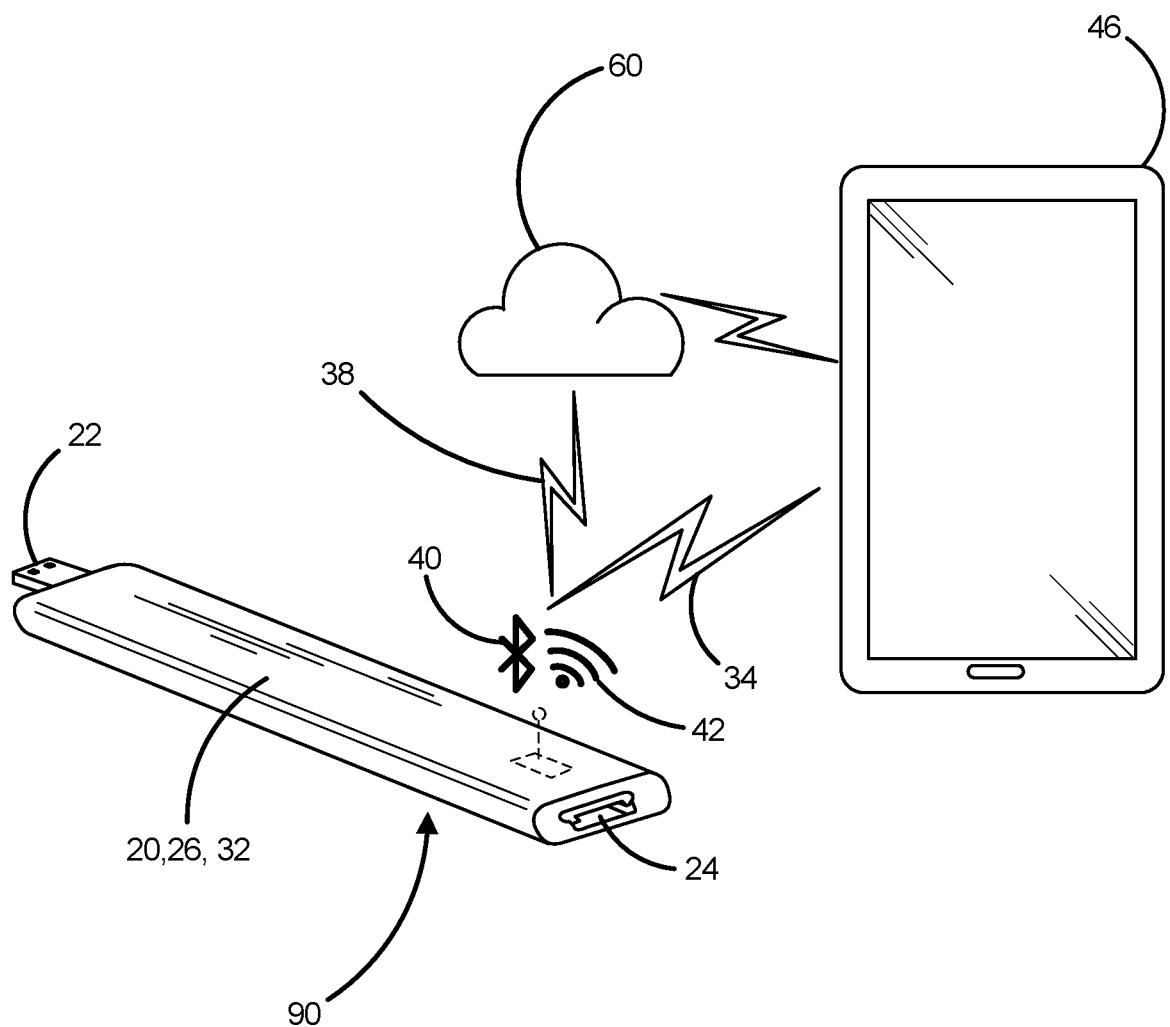
FIG. 3 is a schematic view of a computer brain portion of a warming wrap system communicating with an electronic interface directly and through a cloud service.
Figure 4:
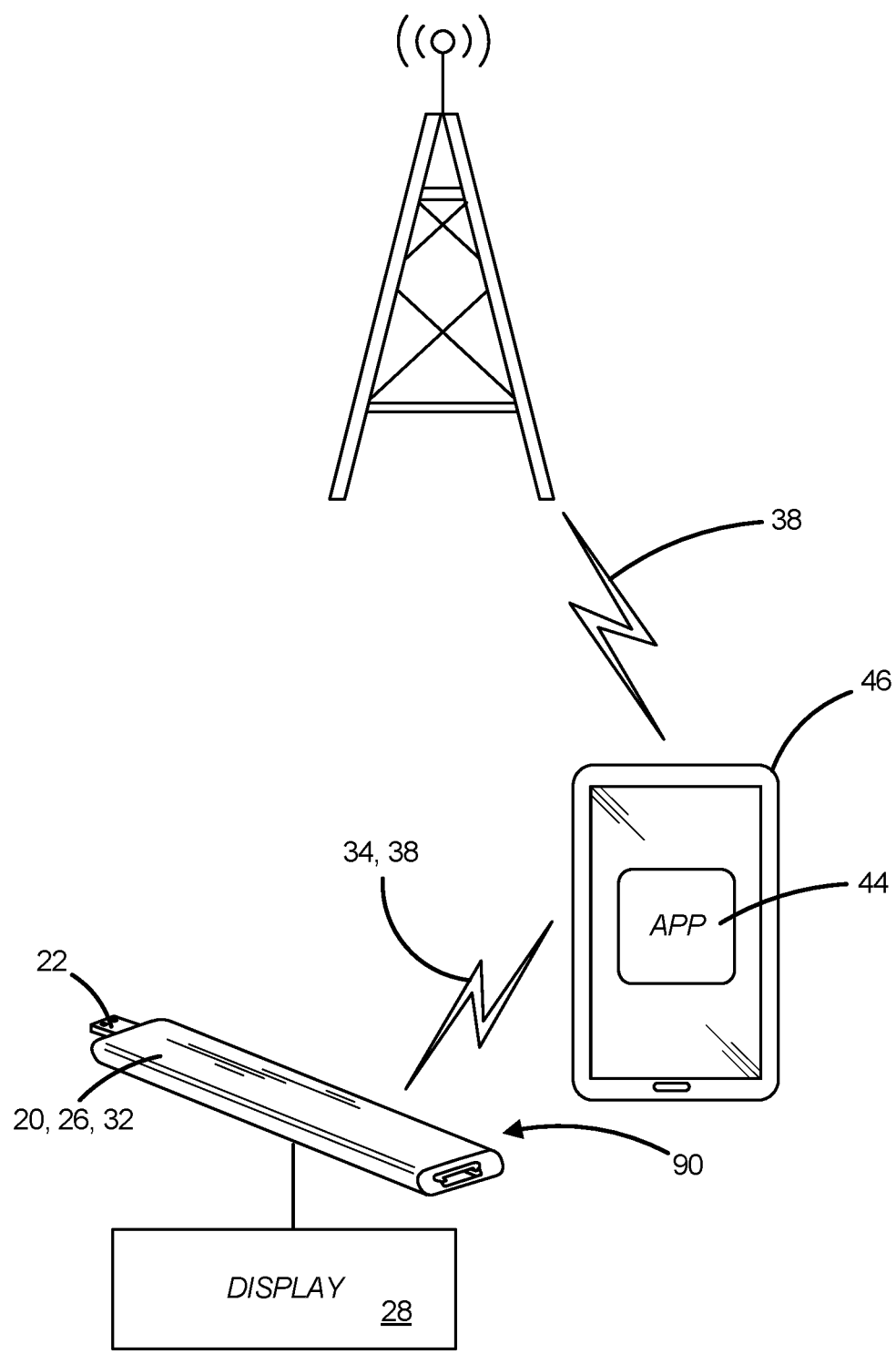
FIG. 4 is a schematic view of a computer brain portion of a warming wrap system transmitting a signal via an application to a transmission service integrated with a display.
Figure 5:
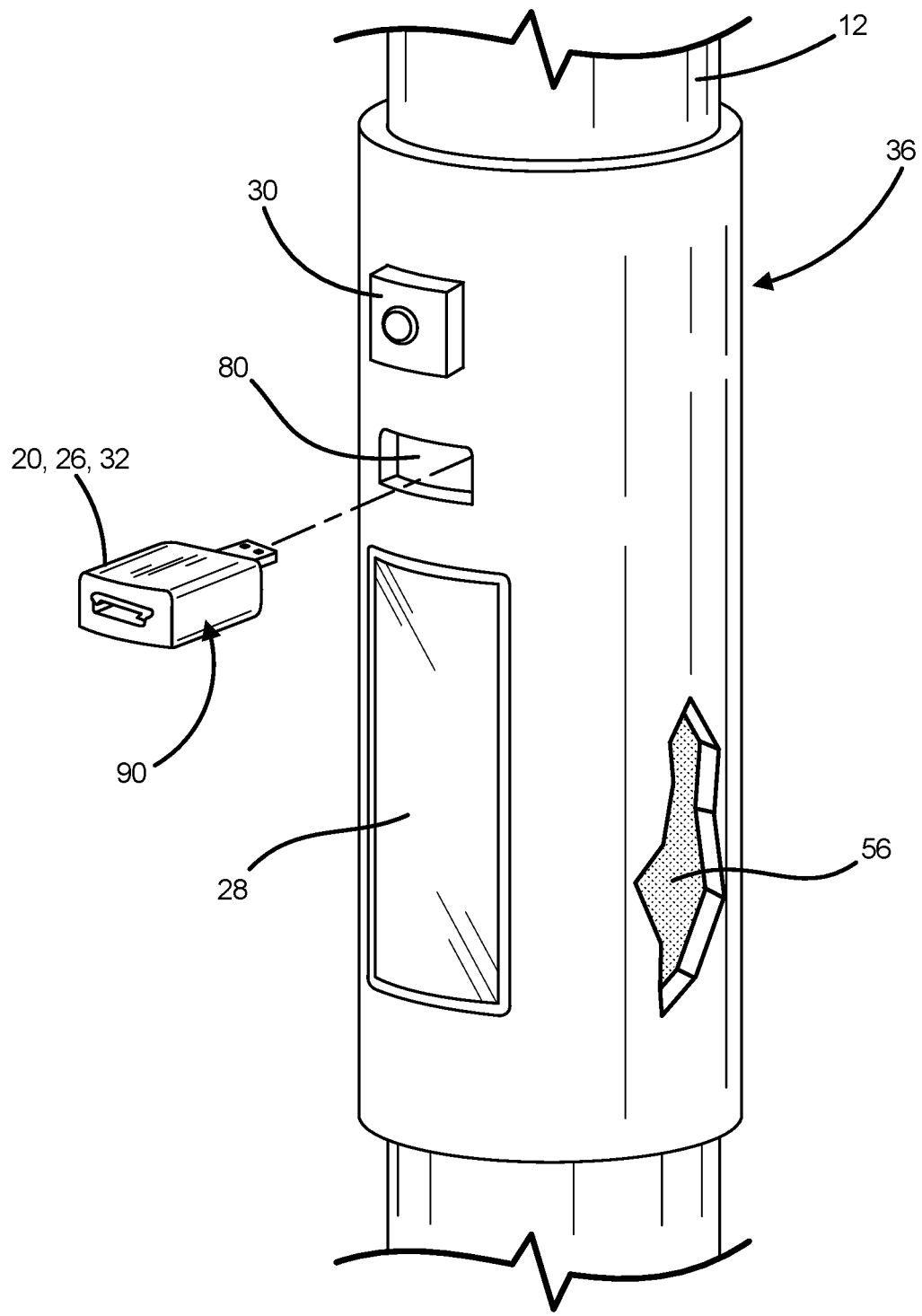
FIG. 5 is a partially exploded perspective view of an outside of a warming wrap system that is integrated into a ski pole and the components of that system.

Referring to FIGS. 1-5, the present disclosure relates to a system comprising layers 10 of material that wrap around a ski pole 12 and provide warmth to a skier. With reference to FIG. 2, layers 10 of the wrap 36 include an outer layer 14 that is preferably water proof or water resistant. The outer layer 14 comprises fabric, plastic, metal, or other material that transmits heat. A heating layer 16 is a heat source. The heating device 18 may comprise carbon fiber, infrared, or other heating device that produces heat. The heating layer 16 is positioned to allow heat to be transmitted from the heating device 18 through the outer layer 14 to a skier who grips the outer layer 14 with his or her hands.

In one example embodiment shown in FIG. 2, the system includes a battery 20. The battery 20 is preferably rechargeable and removable from the system. It is also preferable that the battery 20 is replaceable in the system. The battery 20 also preferably contains a rechargeable port 22 such as a USB, mini-USB, micro-USB, USB-C or other connection that transmits electricity and communicates information. The battery 20 will preferably contain a second port 24 such as a USB, mini-USB, micro-USB, USB-C that allows users to chain a second battery. One of ordinary skill in the art will recognize that a wide range of batteries will operate the system. A preferable battery 22 option is a rechargeable lithium-ion battery.

The battery may also be comprised of a textile-based battery. One such example is a bacteria-powered battery that creates and power through body bacteria such as body sweat or dirty water. Textile-based batteries use microbial fuel cells, which use bacteria to trigger reduction and oxidation reactions. A catalyst may include *Pseudomonas aeruginosa*. One of ordinary skill in the art would understand the use of the textile-based battery upon review of the article titled Flexible and Stretchable Biobatteries: Monolithic Integration of Membrand-Free Microbial Fuel Cells in a Single Textile Layer published on Nov. 6, 2017 by Sumiao Pang, Yang Gao, and Seokheun Choi, which is incorporated herein by reference.

The textile-based battery may be integrated directly into the system or worn as a clothing item and used as a charging system for another battery. By way of example, a skier may wear a hat, shirt, jacket, or pants that consist of the textile-based battery. A skier may wear the textile-based battery and transmit the charged electricity to another battery type, which may then be used to power the described system.

An alternative charging system includes solar energy. Yet another alternative charging system includes generating electricity by movement.

The system includes a computer brain 26, which may be a computer, micro-processor, micro-controller, integrated circuit or other central processing unit (CPU). The computer brain 26 controls the levels of heat produced by the heating device 18 and controls the information on a display 28. The computer brain 26 is preferably connected to a switch 30, which enables the heating device 18 to be turned on and off. Alternatively, the switch 30 may be directly connected to the electronics of the heating device 18. The computer brain 26 also operates a beacon 32 that may be used to transmit distress and other communications signals 34 (also known as "transmissions"). Alternatively, the beacon 32 may work independently of the computer brain 26.

Figure 12:
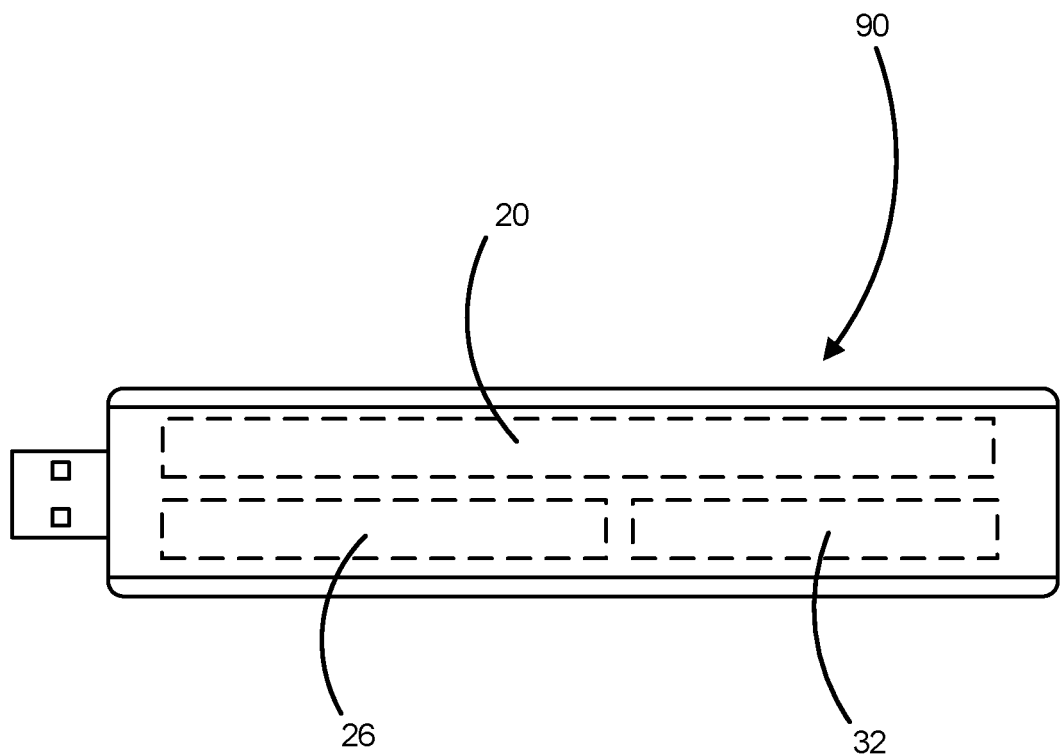
FIG. 12 is a top plan view of an embodiment of a single electronic device having the battery, computer brain, and beacon removable from the warming wrap system of the prior FIGS.

The battery 20 is preferably integrated with the computer brain 26, but one of ordinary skill in the art would recognize that the battery 20 and computer brain 26 may be separate components that are joined as part of the overall system. As shown in FIG. 12, the battery 20, computer brain 26 and beacon 32 are preferably combined in a single electronic device 90 that may be removable from the warming wrap 36 system.

The switch 30 enables the skier to toggle the heating device on and off. In the on position, the heating device will transmit heat. In the off position, the heating device will not transmit heat. Alternatively, the switch 30 may have multiple levels that may be adjusted by the skier. One adjustable switch 30 provides for control of different temperatures and is operable by turning the switch 30 to a more intense position. The switch 30 may be mechanical or electrical. In the preferred embodiment, the switch is integrated with the computer brain 26 and a display 28 in a manner such that the skier will be able to adjust the heat levels.

The switch 30 may be connected directly to the warming wrap 36 or may be operated remotely. If operated remotely, the switch 30 will be connected via a communications system 38 such as BlueTooth 40 or WiFi 42 to the computer brain 26 to manage the temperature of the heating device 18 and other operations of the warming wrap 36. The switch 30 may have a single button or multiple buttons. A multi-button configuration may include different levels of heat, such as high heat, low heat, and no heat. The switch 30 may also be a turn-style switch that may be turned to increase or decrease temperature. The remote version of the switch 30 may include such varied technology.

A display 28 provides information regarding the system such as the heat levels, external temperature, snow temperature, snow reports, light condition, snow depth, time, geographic location, altitude, maps, trail reports, test reports, weather, advertisements, news updates, and ski lift information. The display 28 may be integrated with a beacon 32 that transmits distress or other signals. The display 28, particularly when a touch screen, may operate as the switch.

The display 28 may be connected to wearable devices that are placed on a skier or a skier's ski equipment. A ski tracker is one example of a wearable device that straps onto a skier's boot and tracks how the skier is skiing. The ski tracker delivers feedback via the display. Alternatively, the ski tracker may interact with an app 44 on a mobile device 46 such as a phone that is connected to the display 28, the battery 20, the computer brain 26, or any combination thereof. The display 28 provides details related to data collected via the wearable device. Alternatively, the display 28 can control the wearable device via interaction on a touch screen or mechanical components integrated with the display 28, such as buttons.

The display 28 may be connected to audio and video devices. An audio device that may be connected to the display is an MP3 player, a cell phone, GPS, or other similar devices. The display 28 may provide control and operation of the MP3 player, cell phone, or other device.

A light source may be placed within the display 28 for viewing during non-optimal lighting conditions. An alternative light source may be placed on the warming wrap 36 in a manner to allow the skier to use the light as a flashlight. Alternatively, the battery 20 source alone or in combination with the computer brain 26 may be used to operate other items that are connected via Bluetooth 40, WiFi 42, a cord 48 or other communications device to the warming wrap, including a speaker, an alarm, a microphone, a video recording device, a camera, GPS, or other electrical equipment.

A microphone may be connected to the warming wrap. The microphone may be connected to a mobile device 46 such as a mobile phone to enable telephone communications. Alternatively, the microphone may be on other radio channels such as citizens band (CB) to communicate with other warming wrap 36 devices. Each warming wrap 36 device may have a unique identification configuration to enable individualized communication.

An optional fastener 50 can be attached to the system in an example embodiment, preferably on the outer layer, to connect the edges of the system to form a wrap around the ski pole 12. The fastener 50 is preferably Velcro (hook 52 and loop 54), though one of ordinary skill in the art would recognize that other fastening technologies will function to enable the system to enclose around the ski pole. Examples of fastening systems include zippers, hooks and eye, frog fasteners, toggle fasteners, metal fasteners, grommets/eyelets, buttons, belts, and cords. It should be noted that there is no requirement for the system to be fully enclosed around the ski pole.

An insulation layer 56 limits the heat from escaping the warming wrap 36 system and exiting to the ski pole 12. The insulation layer 56 is placed within the warming wrap 36 system in a manner such that the insulation layer 56 is placed between the heating device 18 and the ski pole 12.

The layers of the warming wrap 36 as described herein are separated to indicate separate functionality. Layers, however, may function in multiple roles. By way of example, a textile-based battery may also act as an insulation layer 56 and grip layer 58. Alternatively, a grip layer 58 may be integrated into an insulation layer 56.

An advantage of the system is that a skier may place the warming wrap 36 system at a location of his or her choosing, preferably in a location that limits issues with balance of the ski pole 12. A grip layer 58 comprises a material that is attached to the warming wrap 36 system and grasps the ski pole 12 to limits the movement of the warming wrap 36 system on the ski pole 12.

The computer brain 26 may transmit information, including information gathered in a skiing session, to an application, website, or other electronic interface. The transmission 34 may be via cellular, Bluetooth 40, WiFi 42, satellite, radio, combination thereof or other communications protocol. The transmission 34 may be directly to the electronic interface or via a cloud service 60 or other electronic transmission.

A beacon 32 transmits distress and other communications signals. The beacon 32 is preferably integrated with the computer brain 26, but may work independently of the computer brain 26. The beacon 32 transmits signals either directly to emergency services or via an application, website, or other electronic interface. While transmission to emergency services or ski patrol is a preferred transmission protocol, the beacon 32 may transmit signals to any programmed location or provider.

A ski pole 12 is the location preferably used to place the warming wrap 36 system described herein. The ski pole 12 can be a downhill ski pole, cross country ski pole, biathlon ski pole. The ski pole 12 can be collapsible or a fixed length. The length of the ski pole 12 may vary. There is no requirement of ski pole 12 length.

While this description has included reference primarily to use of the warming wrap 36 system in connection with ski poles 12, the warming wrap 36 system may be used in connection with other devices, including, other sporting equipment such as fishing poles, golf clubs, tennis racquets, horse reins, snowmobile handles, and climbing equipment; outdoor tools such as shovels, hoes and rakes; and indoor devices such as video game controllers. The warming wrap system may alternatively be fastened around a mobile device 46 such as a cell phone or other electronic device to maintain the battery power of such device in cold temperatures.

A method of warming a person's hands includes placement of a warming wrap 36 with the features described herein on a ski pole 12 or other equipment as described herein. The warming wrap 36 can be in a non-fastened state as shown in FIG. 1A and a fastened state as shown in FIG. 1B. A user of the warming wrap 36 takes the warming wrap 36 in its non-fastened state as shown in FIG. 1A and wraps it around a ski pole 12. The user then fastens the warming wrap around the ski pole 12 in a manner whereby the warming wrap 36 is secured in a preferred location on the ski pole 12. A heating device 18 is turned on and off via a switch 30 that is activated by the user. The user controls the temperature of the heat via the switch 30 or an interactive display 28 that is coupled with the heating device 18. Alternatively, the switch 30 and display 28 are connected whereby the user may control the switch 30 via the display 28 or control the display 28 via the switch 30. The switch 30 and interactive display 28 are alternatively connected to a computer brain 26, which provides additional processing capabilities to the user to control the heating device 18 and temperature radiating therefrom. The user starts the heating device 18 by activating the switch 30. The user controls the temperature of the heating device 18 via the switch 30, display 28, or via a connected application, website, or other electronic interface. The user places his or her hands 82 or other body part on the outer wrap portion of the warming wrap 36, which allows the heat from the heating device 18 portion to reach the user. An insulation layer 56 limits the escape of heat into the ski pole 12. A grip layer 58 limits the warming wrap 36 from slipping away from the user's desired placement of the warming warp 36 on the ski pole 12. The user may interact with the heating device 18 and other features described herein via the display 28. To return the ski pole 12 to its natural state, the user removes the warming wrap 36 by unfastening the fastening mechanism 50. The user places the warming wrap 36 on other sporting equipment, tools, or indoor devices. The user may charge the battery 20 by connecting the battery 20 to a charge. One of ordinary skill in the art will understand that the charge may come from a wall outlet, a USB connection, or another form of electricity. Alternatively, the user may wear a textile-based battery to power the heating device 18 or charge the battery 20 connected to the heating device 18. The user may remove the computer brain 26 or battery 20 from the warming wrap 36 and replace the computer brain 26 or battery 20 without discarding the remaining components of the warming wrap. In one embodiment, the brain 26 and battery 20 are combined and inserted into the warming wrap 36 via a port 80.

The system of the present disclosure includes layers 10 that form a warming wrap 36 that directs heat for warmth to a user when the warming wrap 35 is placed on a handheld device such as a ski pole 12. The term "handheld device" includes any device where the operator uses his or her hands 82 to operate the device. Handheld devices include sporting equipment such as ski poles, fishing poles, golf clubs, tennis racquets, horse reins, and climbing equipment; outdoor tools such as shovels, hoes and rakes; and indoor devices such as video game controllers. The present invention is not limited to handheld devices and may be used in connection with heating body parts other than the hands or providing warmth to devices. The outer layer 14 is comprised of fabric, plastic, metal, or other material that transmits heat. The term "transmission" is intended to include both transmission and transfer. For example, heat may be transmitted from the outer layer 14 directly or transferred from the heating layer 16 through the outer layer 14. A heating layer 16 is a heat source. The heating device 18 (also referred to as a heating element) may be comprised of an electric heating device 62 or non-electric heating device 64 that produces heat. Examples of electronic heating devices 62 include battery operated heating coils, defroster line heaters, and heating pads, and other devices that rely on electricity to produce heat. Non-electric heating devices 64 may include mechanical, thermal, and chemical devices, examples of which include disposable hand warmers, toe warmers, foot warmers, body warmers, friction-producing devices, and other devices that do not rely on electricity to produce heat. The heating layer 16 is positioned to allow heat to be transmitted from the heating device 18 through the outer layer 14 to a skier who grips the outer layer 14 with his or her hands 82, another appendage or body part. An insulation layer 56 is included to limit heat from being diverted away from the outer layer 14. A grip 66 is included on a grip layer 58 of the warming wrap 36 to prevent the warming wrap 36 from slipping from the intended location on the device such as a ski pole 12.

The insulation layer 56 is preferably constructed of a lightweight, flexible, thermally insulating fiber material that has desirable insulating characteristics. One such synthetic insulation material that may be used as the insulation layer 56 is sold under the trade name "Thinsulate" and is commercially available from 3M Corporation of St. Paul, Minnesota Thinsulate is a thermal insulation made of non woven synthetic fibers. While Thinsulate is described herein, it is not required to practice the disclosed embodiment and other commercially available insulations may be used.

Figure 7:
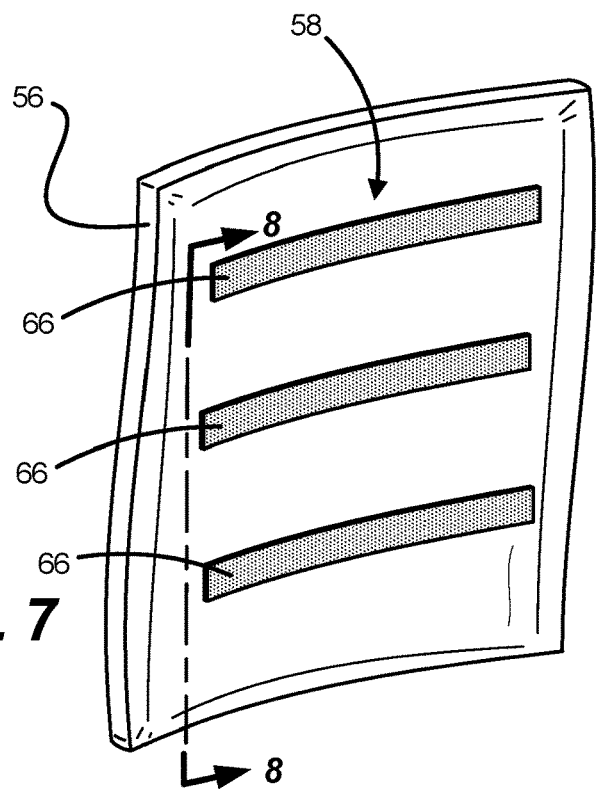
FIG. 7 is a perspective view of a preferable relationship of the components of the warming wrap system.

The grip layer 58 as shown in FIG. 7 is preferably constructed of an antislip fabric that can be inserted into the warming wrap 36 either by sewing, gluing, or another form of adhesion. An example of an antislip fabric is antislip strips that are added to the waistbands of pants. Example embodiments of antislip fabric strips that can be used in preferred arrangements are described in U.S. Pat. App. No, US20020071939, which is incorporated herein by reference. The antislip fabric disclosed herein is but one example of a grip that can be used in the current disclosure. Other commercially available grips may be used to fulfil the goal of preventing slipping.

Figure 6:
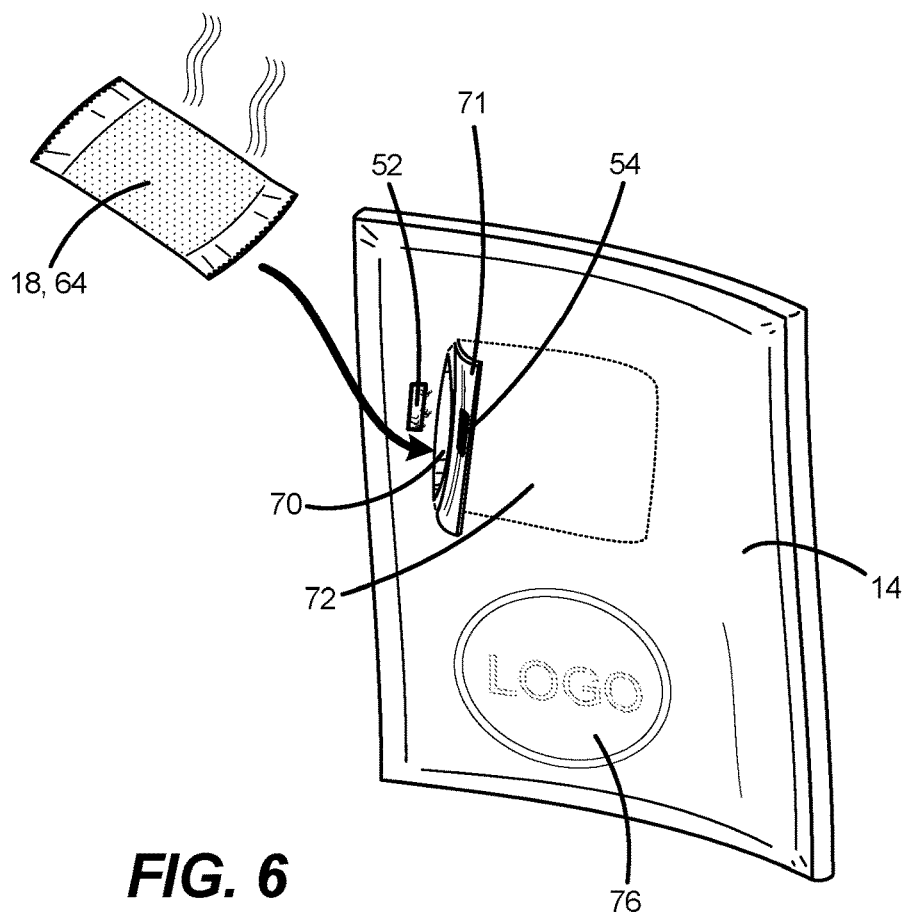
FIG. 6 is a perspective view of a preferable relationship of the components of the warming wrap system.

An example of a non-electronic heating device 64 as shown in FIG. 6 is an air-activated heating pack that comes in various styles, including hand warmers, body warmers, foot warmers, insole foot warmers, toe warmers, pocket warmers, super warmers, seat warmers, clothing adhesive warmers, biodegradeable warmers, shipping warmers, and food warmers. These air-activated heating packs are wrapped in a plastic film and, upon exposure to air, create a chemical reaction that creates heat. One example of a manufacturer of air-activated heating packs is Heatmax, Inc., which is a subsidiary of Kobayashi Pharmaceutical Co., Ltd. Heatmax manufactures HotHands brand air-activated heating packs. Another example of air-activated heating packs is Grabber brand hand warmers by Grabber, Inc., which is a subsidiary of Heatmax, Inc. Another example of air-activated heating packs is PIP Heat Packs air activated hand warmers by PIP Global. An example of a non-electric heating device 64 that can be used in the described disclosure herein is an air-activated heating pack manufactured by Heatmax, Inc. U.S. Pat. No. 6,886,553 titled "Self-contained personal warming apparatus and method of warming" describes the features of various air-activated heating packs. United States Patent Application Nos. 20070256679A1 ("Warming devices with elastic disposed therein and methods of warming"), 20070256677A1 ("Multi-seamed warming devices with adhesive and methods of warming"), and 20070256678A1 ("Multi-seamed warming devices with adhesive disposed thereon and methods of warming") further describe air-activated heating packs and additionally the addition of elastic material to permit flexible movement of the heating packs. U.S. Pat. No. 6,886,553 and U.S. Patent App. Nos. 20070256679A1; 20070256677A1; and 20070256678A1 are incorporated herein by reference. Additional example embodiments of disposable heat packs that can be used in preferred arrangements are described in U.S. Pat. Nos. 4,366,804, 4,649,895, and 5,046,479, each of which is incorporated herein by reference.

Another example of a non-electric heating device 64 is a reusable heat pack that is charged in boiling water, a microwave, or other heating application. Example embodiments of reusable heat packs that can be used in preferred arrangements are described in U.S. Pat. Nos. 4,077,390; 4,880,953; and 5,645,749, each of which is incorporated herein by reference.

Another example of a non-electric heating device 64 is a heat press with chemical reactant. An example embodiment of a heat press with a chemical reactant that can be used with the preferred arrangement is described in U.S. Pat. No. 5,545,197, which is incorporated herein by reference. The heat press with chemical reactant has at least two compartments that contain different chemicals. A rupturable seal or seam divides the two or more compartments. When the rupturable seal or seam is broken, the chemical components in each of the compartments mix causing a chemical reaction that produces heat. In the configuration of the wrap described herein that uses a slap-device 68, the action of slapping the warming wrap 36 onto a handheld device such as a ski pole will break the rupturable seal or seam, which will cause the chemical reaction to produce heat.

Figure 8:
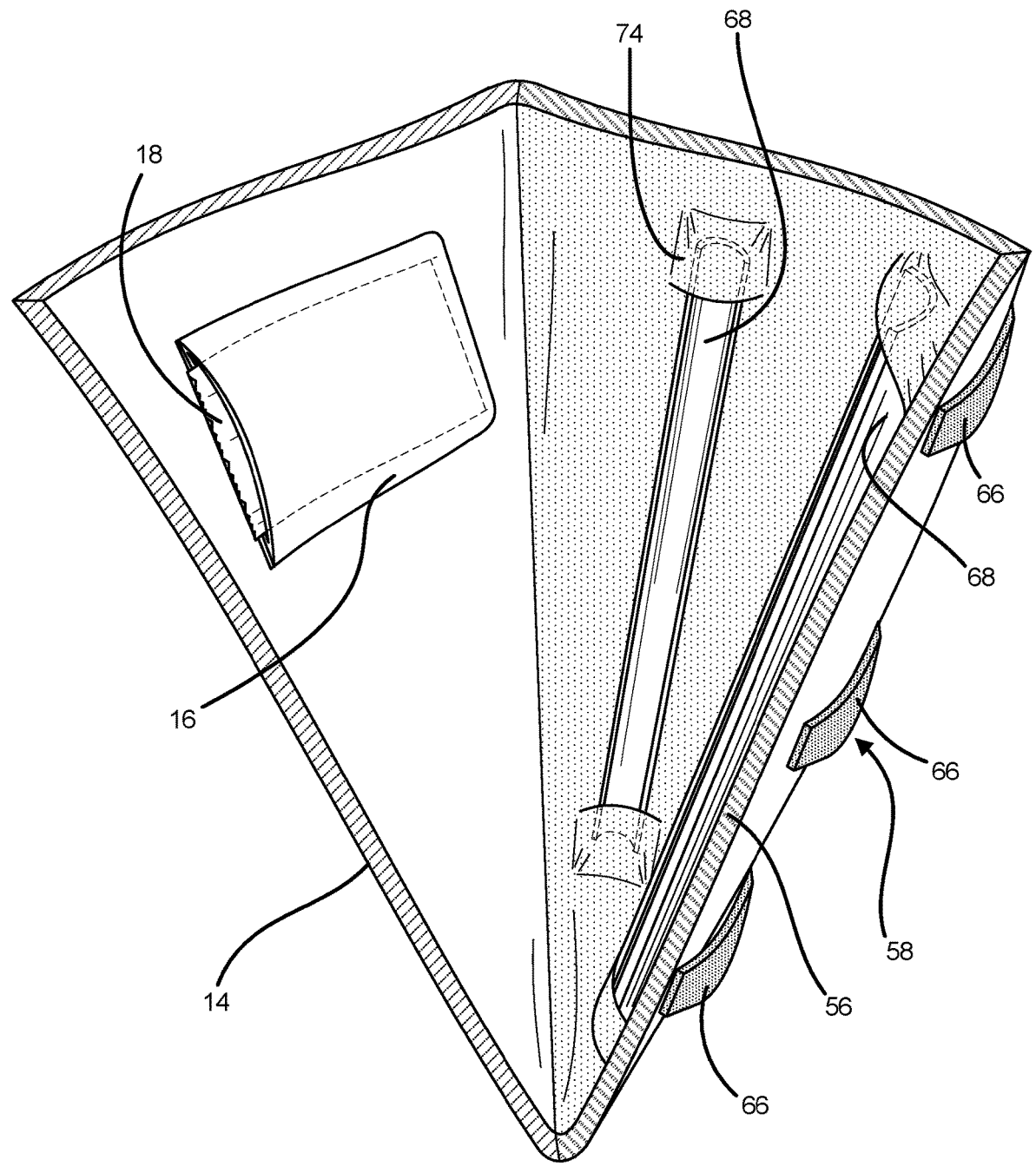
FIG. 8 is a perspective view of components of a warming wrap system and a preferable relationship of the internal components of the warming wrap system.

Referring to FIGS. 6-8, the heating device 18 of the heating layer 16 may be removable and/or replaceable. An opening 70 in the outer layer 14 to the heating layer 16 enables the placement of a heating device 18 into the heating layer 16. A heating device chamber 72 is preferably included as a receptacle for the heating device 18. The heating device chamber 72 holds the heating device 18 in the proper placement within the heating layer 16 and within the warming wrap 36 in general. The heating device chamber 72 has an opening 70 that is preferably closable using a fastener 50 (or fastening mechanism) such as Velcro (hook and loop), buttons, zippers, interlocking edges such as a zip-locking closure, or any other mechanism that will prevent the unintended removal of the heating device 18. The placement of the heating device chamber 72 will vary based on the application of the warming wrap 36. In one embodiment, a portion or the outer layer 14 may be opened to form an opening 70 on the outer layer 14 that enables access to the heating layer 16 and the heating device chamber 72. The opening 70 may be closed using a fastener 50. In another embodiment, a portion or the entire outer layer 14 may be separated from the other layers to enable the placement of the heating device 18 within the heating layer 16 and thereafter reattach the outer layer 14 to the other layers. This is accomplished through the use of a fastener (50) such as a hook and loop system (e.g., Velcro). In another embodiment, a zipper on the outer layer 14 provides access to the heating layer 16 and the heating device chamber 72. Those of ordinary skill in the art will understand other mechanisms that may be used to gain access to and insert the heating device 18 into the heating device chamber 72. The heating device chamber 72 may be accessed one or more than one time with a new or recharged heating device 18.

Figure 9A:
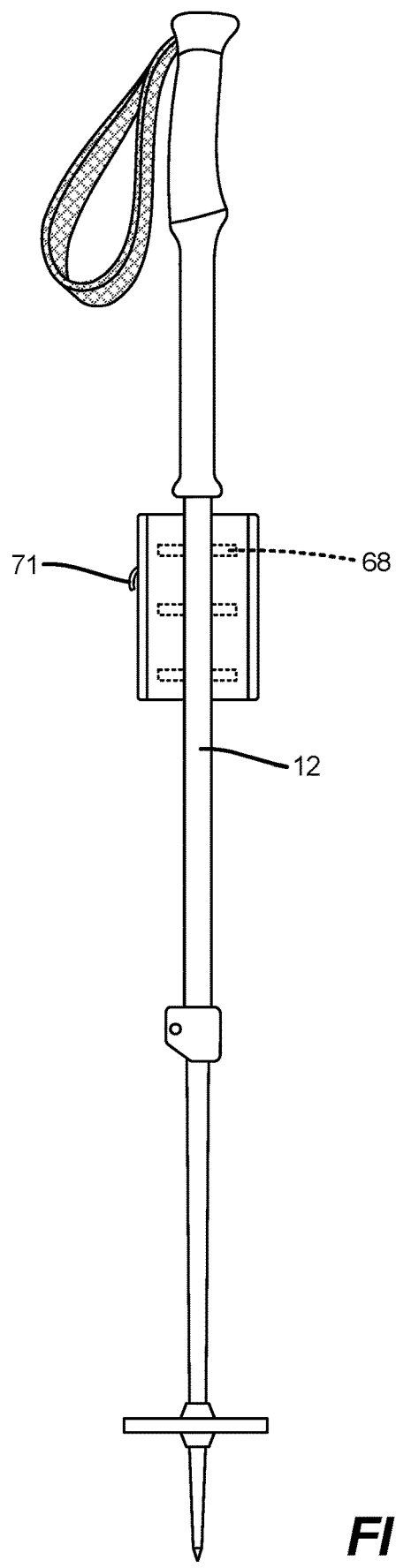
FIG. 9A is a side elevational view of a warming wrap system and fastener arrangement prior to placement on a ski pole.
Figure 9B:
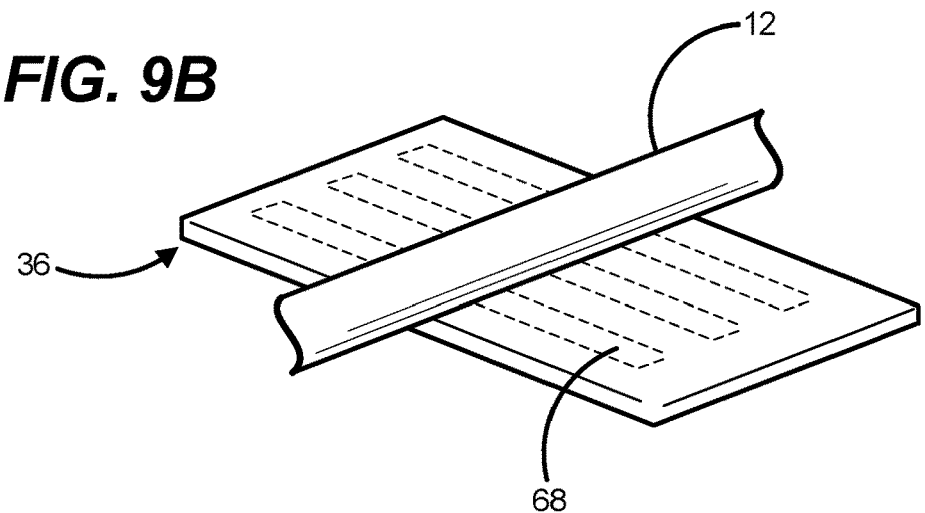
FIG. 9B is a perspective view of a warming wrap system and fastener arrangement prior to placement on a ski pole.
Figure 9C:
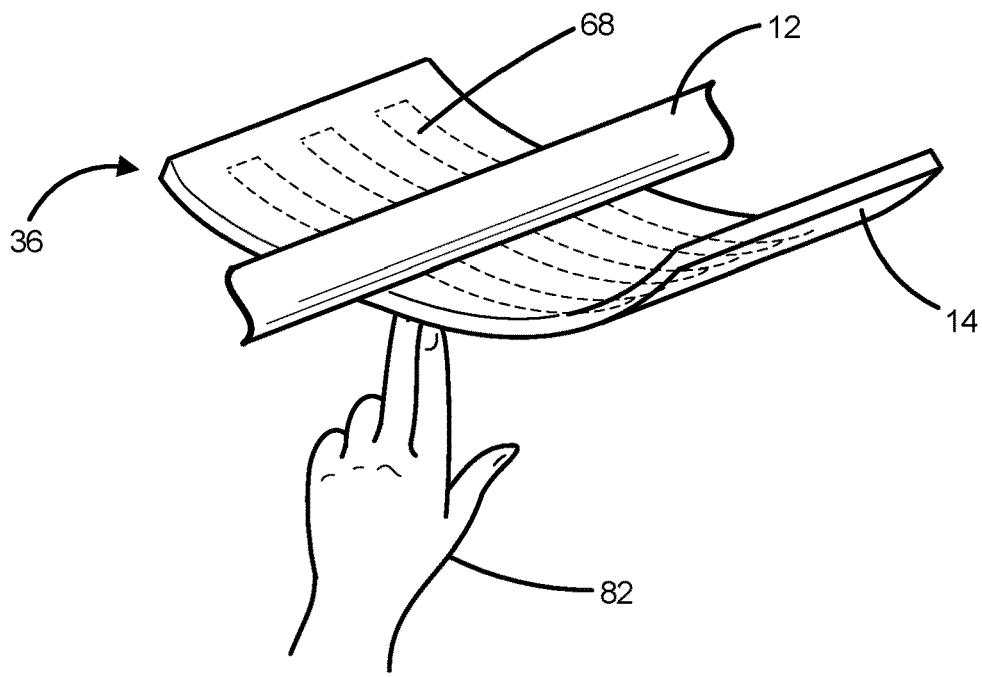
FIG. 9C is a perspective view of a warming wrap system and fastener arrangement during the placement of the warming wrap system onto a ski pole.
Figure 9D:
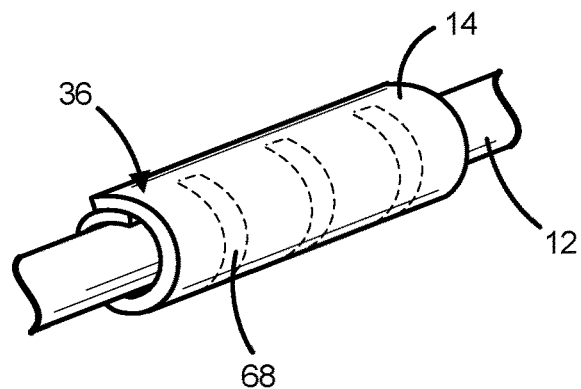
FIG. 9D is a perspective view of a warming wrap system and fastener arrangement after placement of the warming wrap system onto a ski pole.

FIGS. 9A-9D show a configuration of a warming wrap 36 using a slap-on device as a fastener arrangement. A slap-on device 68, preferably integrated in the insulation layer 56, enables the warming wrap 36 to be wrapped around a ski pole 12 or other handheld device. Examples of a slap-on device 68 includes a bi-stable ribbon spring and self-coiling metal strips. FIG. 9A shows the warming wrap 36 in a desired position on a ski pole 12 prior to activating and fastening the slap-on device 68. FIG. 9B shows the slap-on device 68 integrated with in the warming wrap 36 in a first stable linear state (or straight position). FIG. 9C shows the slap-on device 68 integrated in the warming wrap 36 in a semi-coiled state (semi-coiled position). A person using his or her hand 82 may activate the slap-on device 68 by hitting the slap-on device 68 within the warming wrap 36 against the ski pole 12. FIG. 9D shows the slap-on device 68 integrated in the warming wrap 36 in a second stable coiled state (or curled position). Also known as spring strips, the bi-stable ribbon spring has a concave face and a convex face. The slap-on device 68 can be partially coiled and partially straight. When the slap-on device 68 is bent, the energy of the spring causes the device to coil as shown in FIGS. 9C and 9D. An example of a commercial version of a bi-stable ribbon spring is the slap wristband that curls up upon being slapped onto an object. The original slap wristband was created in 1983 by Stuart Anders, a high school teacher in Sun Prairie, Wisconsin That slap wristband went by the name Slap Wraps and were sold by Main Street Toy. Additional description of bi-stable springs and application of slap-on devices are set forth in U.S. Pat. No. 7,347,019 titled "Devices Incorporating A Bi-Stable Ribbon Spring" and U.S. Pat. No. 6,425,494 titled "Insulator Wrap for Beverage Container." The description of the bi-stable spring and self-coiling applications set forth in these patents are incorporated herein by reference. A proposed explanation for the behavior of a snap-spring or bi-stable ribbon as set forth in U.S. Pat. No. 7,347,019 and incorporated herein by reference follows:

1) When in a stable coiled state the longitudinal stresses of the snap-spring (or ribbon) are generally relieved. The coiling of the ribbon also acts to flatten the arcuate cross-section, which now strains the ribbon in the transverse direction.
2) By applying a longitudinal or tensional force, the ribbon can be progressively uncoiled which now imparts longitudinal strain to the uncoiled portion of the ribbon. Also, as the ribbon is uncoiled, the transverse strain is relieved as the ribbon returns to its arcuate cross-section.
3) As the ribbon is fully uncoiled and extended into a linear shape the formation of the arcuate cross-section progresses along the full length of the ribbon.
4) When the ribbon is fully extended a "snap" occurs as the transverse strain is relieved.
5) In this fully extended, stable linear shape, the arcuate cross-section has a bending moment of inertia that resists the longitudinal coiling stresses developed as a result of the straightening or uncoiling of the ribbon. Thus the ribbon can remain in this linear configuration and resists re-coiling. The ribbon is also characterized as having a degree of column stiffness and therefor has a degree of bending resistance.
6) Affecting a "snap", the linear ribbon is buckled and the arcuate cross-section is flattened in the buckled area, inducing transverse strain. The longitudinal stresses will now induce a recoiling of the ribbon.
7) The recoiling of the ribbon initiates at the point of buckling and progresses down the length of the ribbon as the longitudinal coiling stresses are relieved and the transverse flattening stresses are accumulated.
8) When fully recoiled the ribbon assumes the stable coiled state of step 1) above.

The slap-on device 68 can vary in size depending on the application. Use of slap-on device 68 can be in place of or in combination of fastener 50, which is used to connect the edges of the system to form a wrap around the handheld device such as ski pole 12. The term "fastener arrangement" is intended to include a fastener 50, a slap-on device 68, an edge wrap 78, and any other application that enables the warming wrap 36 to be secured in place on a handheld device such as a ski pole 12. The slap-on device 68 may go around the entire ski pole 12 or a portion of the ski pole 12 or other device. The slap-on device 68 may also go around the ski pole 12 or other device more than one time. The warming wrap 36 using a slap-on device 68 may be removable from the ski pole 12 or other device by causing the slap-on device 68 to return from its curled position to its straight position.

A system that uses both a removable heating device 18 and a slap-on device 68 will include an outer layer 14, a heating layer 16, an insulation layer 56, and a grip layer 58. A heating device chamber 72 will be preferably within the heating layer 16. The outer layer 14 will have an opening 70 that provides access to the heating device chamber 72 within the heating layer 16. There is no requirement that the heating device chamber 72 be separate from the heating layer 16. An insulation layer 56 will preferably have one or more than one slap-on devices 68 that will enable the warming wrap 36 to be in a straight position or a curled position. The slap-on device 36 will cause the warming wrap 36 to curl around the ski pole 12 or other device when activated. Activation occurs when the slap-on device 68 within the warming wrap 36 is struck against the handheld device such as a ski pole 12, which then causes the warming wrap 36 to curl around the ski pole 12 or other handheld device. While in a curled position, the grip layer 58 will be in contact with the ski pole 12 or other handheld device. Both electric heating devices 62 and non-electric heating devices 64 may be used in this warming wrap 36 system.

In an embodiment with a single slap-on device 68, it is preferable to have the slap-on device 68 placed in between the edges of the insulation layer 56. In an embodiment with two slap-on devices 68, it is preferable to place the slap-on devices 68 near the outer edges of the warming wrap 36 as part of the insulation layer 56. In an embodiment with more than two slap-on devices 68, it is preferable to have the slap-on devices 68 placed evenly within the insulation layer 56. There is no requirement as to the specific placement of the slap-on device 68 in these embodiments. The slap-on device 68 may also be placed in any of the outer layer 14, heating layer 16, insulation layer 56, or grip layer 58. The slap-on device 68 may also be an added layer. The slap-on devices 68 can be secured in the warming wrap 36 using conventional methods of securing, including the use of an adhesive, braces, stays, sewing or stitching, or any other means of connecting the slap-on device 68 in the desired location within the wrap. FIG. 8 shows the slap-on devices 68 secured using stays 74. To permit a relative sliding motion between the slap-on device 68 and the layers within the warming wrap 36 system, a preferred connection will be on the ends of the slap-on device 68 such as set forth in FIG. 8. Further description of the placement of a slap-on device 68 into a device is set forth in U.S. Pat. No. 7,347,019, which is incorporated herein by reference. While many commercially-available slap-on devices 68 will come with laminate, fabric, plastic, or another coating, such coating is optional and preferably not used in connection with the system described herein.

There is no requirement that the functional components in each layer described herein must be throughout the entire layer. For example, in one embodiment whereby the warming wrap 36 encircles a ski pole more than one time, the heating device 18 can be positioned in the section of the heating layer 72 that will be under the outer layer 14 that is exposed as opposed to the portions that are covered with an insulation layer 56. There is also no requirement for the warming wrap 36 system to be fully enclosed around the ski pole 12 or other handheld device. For example, the warming wrap 36 can be assembled with a slap-on device 68 that encircles a portion of the circumference of the ski pole 12, leaving the other portion of the circumference without a warming wrap 36. In another embodiment, the warming wrap 36 will include an adhesive layer, which may be in combination with or in place of the grip layer 58, that enables the wrap to be adhered to a device. The adhesive layer can be used in combination with or in place of the fastener 50. The grip layer 58 may be an adhesive layer wherein the grip material is one that adheres to the handheld device.

The outer layer 14 is preferably a water resistant fabric, though any material that is capable of transferring heat is acceptable. Fabric examples that are water resistant include nylon, ripstop nylon, nylon taffeta, polyester, polyurethane laminate (PUL), thermoplastic polyurethane (TPU), and microfiber with coating. Other fabrics may be used with a coating of a waterproofing agent such as wax, rubber, or polyvinyl chloride. It is preferable that the fabric is capable of being printed upon using sublimation printing or other printing techniques as depicted in FIG. 6 (inclusion of LOGO 76). Sublimation printing is a technique that uses heat sensitive inks. The inks turn into gas under the influence of heat and combine with the fabric medium. Because the ink becomes part of the material structure, the printing on the fabric has less tendency to fade or crack. Example fabrics that may be used for sublimation printing include polyester, nylon, Lycra, Spandex (elastane), other elastic fabrics, and other fabrics that can withstand high temperatures. The heat press with chemical reactant has at least two compartments that contain different chemicals. An example embodiment of fabric with sublimated printing that can be used with the preferred arrangement is described in U.S. Pat. No. 5,246,518, which is incorporated herein by reference. There is no requirement to use the foregoing fabric examples or sublimation printing in connection with the outer layer 14 of the warming wrap 36.

The warming wrap 36 may accommodate different sized and shaped devices. There is no requirement that the wrap be used on a circular ski pole 12. The description of the warming wrap 36 in connection with a ski pole 12 is to illustrate the functionality of the warming wrap 36. The warming wrap 36 can be designed to go on any shape or device and can be manufactured in any shape. One embodiment of the warming wrap 36 is to be used to encircle a portion of or the entire diameter of a ski pole 12. Another aspect of the present disclosure is to increase or decrease the size of the wrap to enable the warming wrap 36 to go on larger or smaller equipment. An example of larger equipment will include a snow shovel, which has a larger diameter than a ski pole 12. The size, including length and width, of the warming wrap 36 and its components can be adjusted to fit the device.

Figure 10A:
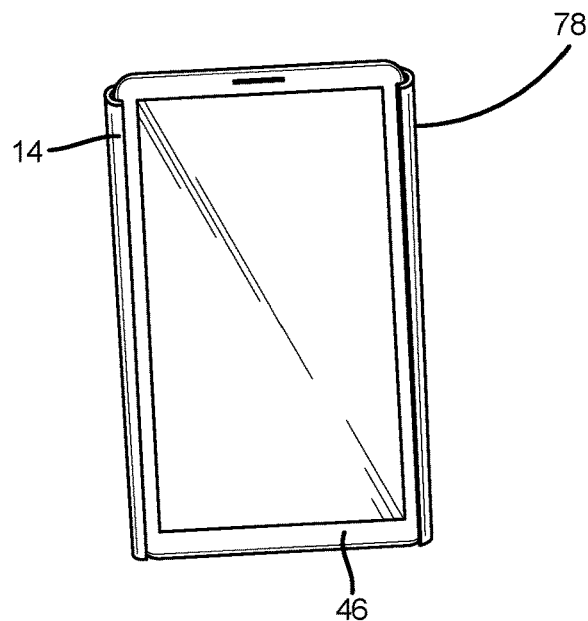
FIG. 10A is a perspective view of a warming wrap system placed on a mobile device.
Figure 10B:
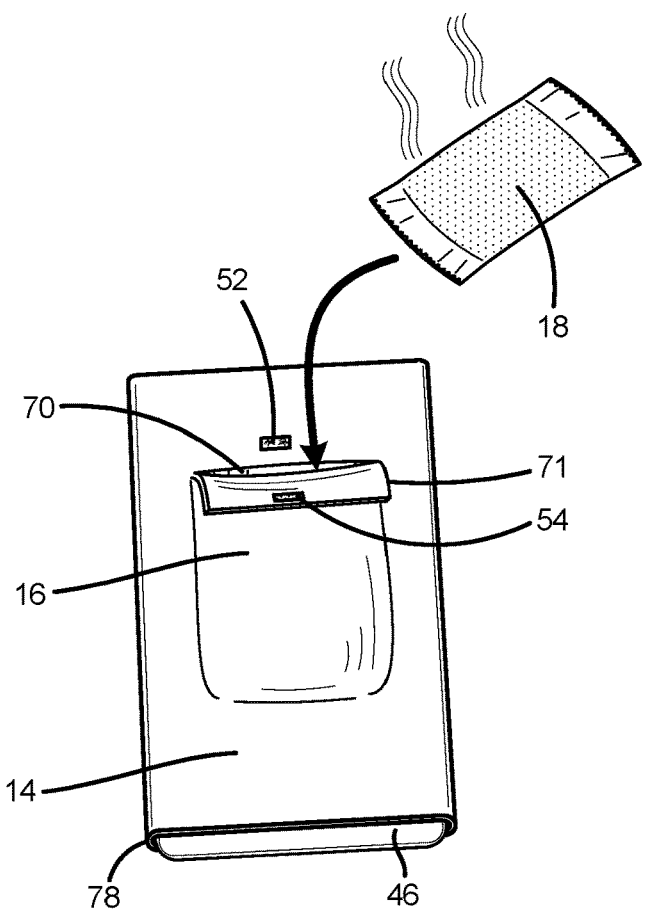
FIG. 10B is a perspective view of a warming wrap system placed on a mobile device.
Figure 10C:
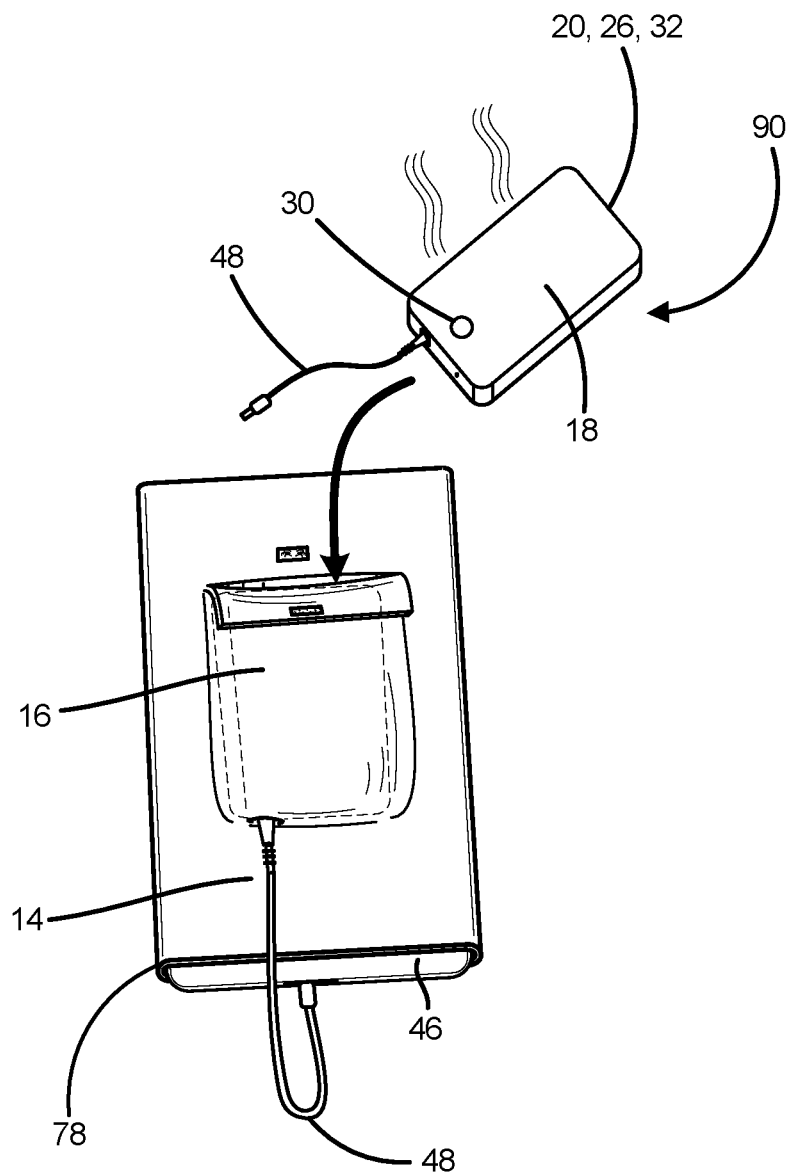
FIG. 10C is a perspective view of components of a warming wrap system placed on a mobile device.
Figure 11:
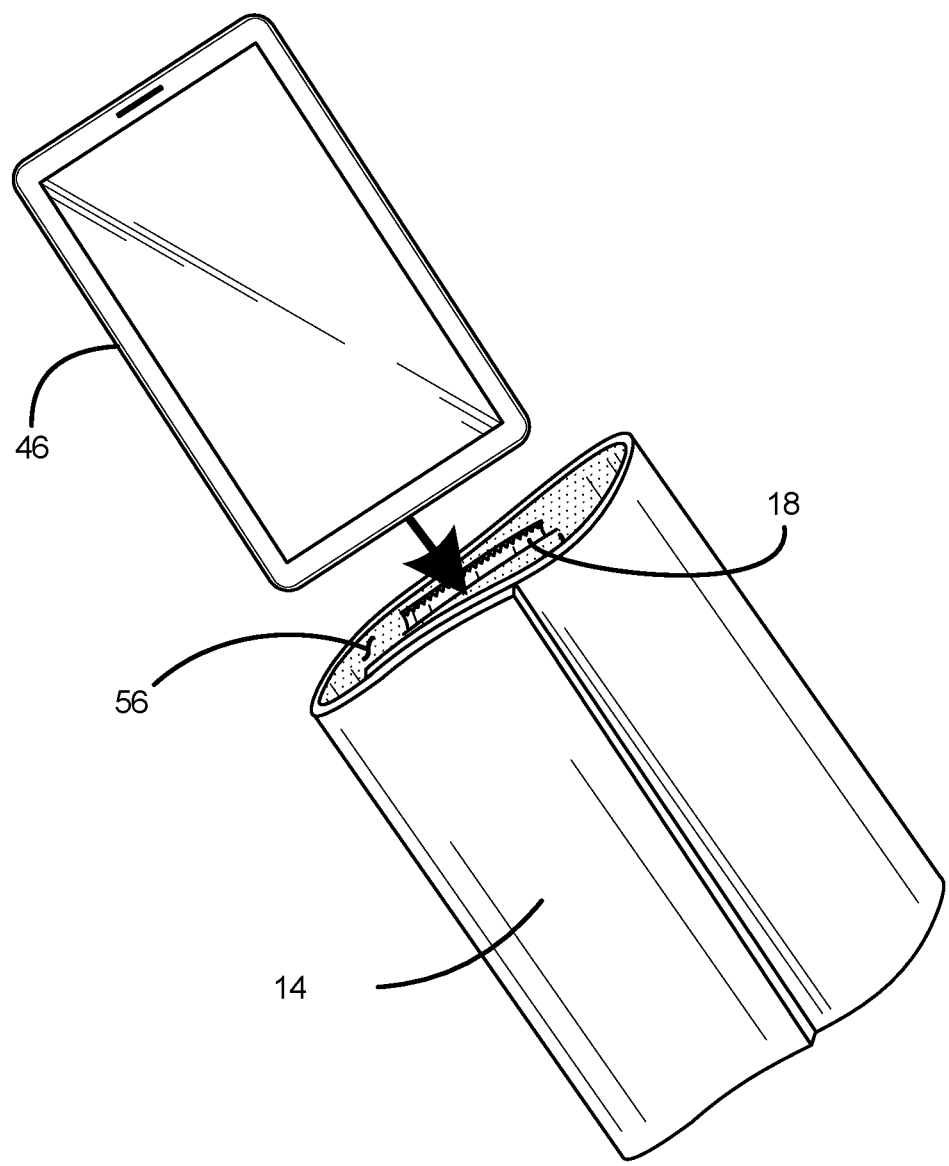
FIG. 11 is a perspective view of a warming wrap system showing the relationship between the warming wrap and mobile device.

The layers 10 of the warming wrap 36 system may reversed or modified to accommodate certain devices. Referring to FIGS. 10A-11, the layers 10 of the warming wrap 36 may be fastened around a mobile device 46 such as a cell phone or other electronic device to maintain the battery power of such device in cold temperatures. In the embodiment set forth in FIGS. 10A, 10B, and 10C, an edge wrap 78 attaches the warming wrap 36 to the back of a mobile device 46 such as a cell phone. Alternatively, an adhesive layer can attach the wrap to, preferably, the back of the cell phone or other electronic device. The adhesive layer acts as the outer layer 14 of other embodiments by allowing the transmission of heat from the heating layer 16 to the mobile device 46. An insulation layer 56 as described in other embodiments can be incorporated into the mobile device application to prevent the escape of heat outside of the warming wrap 36. The heating device 18 may be removable and/or replaceable. The heating device 18 may be electronic or non-electronic. For electronic heating devices 62, a battery or other energy source may be incorporated directly in the wrap or the electronic heating device 18 may be plugged directly into the mobile device 46 using the cord 48, induction technology, or other form of charging communication. For the embodiments that include a battery 20 or other energy source within the warming wrap 36, the battery 20 can be plugged into the mobile device 46 to provide electricity and/or charge to the mobile device 46.

The edge wrap 78 of the warming wrap 36 set forth in FIGS. 10A, 10B, and 10C may be elastic fabric, plastic, or other materials that partially or fully wrap around and stretch or snap into place. In one embodiment, the outer layer 14 of a warming wrap 36 may be composed of an elastic material that stretches around the sides of a mobile device 46 or other electronic device. The outer layer 14 is positioned to transmit heat from the heating layer 16 to the back of the mobile device 46 to maintain the batter power of such device in cold temperatures. The heating layer 16 will include a heating device 18 that is either electronic or non-electronic as previously described herein. Another embodiment uses plastic wrap onto the back of a mobile device 46. In a preferred embodiment, the edge wrap 78 is includes plastic that stretches over the corners of a mobile device 46 or other electronic device and snaps into place. The outer layer 14 is positioned to transmit heat from the heating layer 16 to the back of the mobile device 46. A portion of the plastic outer layer may be removed to permit additional heat to transmit from the heating layer 16 to the mobile device 46.

The layers 10 of the warming wrap 36 may be configured to provide heat to the mobile device 46 or reversed to provide the heat to the mobile device 46 user. An insulation layer 56 may be removable and/or configurable to be placed at different positions of the warming wrap 36. In one configuration, the outer layer 14 will be next to the mobile device 46 followed by the heating layer 16, the insulation layer 56, and the grip layer 58. In another configuration, the grip layer 58 will be placed next to the mobile device 46 followed by the insulation layer 56, the heating layer 16, and the outer layer 14. In another configuration, the layer closest to the mobile device 46 will transmit heat, followed by a chamber to place an insulation layer 56, followed by a heating layer 16, another chamber to place an insulation layer 56, and an outside layer 14. The user may choose to place the insulation layer 56 in either of the chambers. Additional chambers for insulation layers 56 may be added to accommodate certain climates. In such cases, there may be one or more than one insulation layers 56.

There is also no requirement that the warming wrap 36 be in full contact with the ski pole 12, mobile device 46, or other handheld device. For example, the warming wrap 36 may be placed around a square handle. In such instance, the warming wrap 36 may only touch the corners of the square handle. In another example, the warming wrap 36 may be placed on a game control device. In such an instance, the warming wrap 36 can be manufactured in a shape that fits on the game control device.

A method of warming a person's hands, other appendages, or devices includes placement of a warming wrap 36 with the features described herein on a ski pole 12 or other handheld device as described herein. The warming wrap 36 can be in a straight position (shown in FIG. 9B) or a curled position (shown in FIG. 9D). While in the straight position, a user of the warming wrap 36 opens the outer layer 14 though through an opening 70 to gain access to a heating device chamber 72 within the heating layer 16. The user places a heating device 18 within the heating device chamber 72 and then closes the outer layer 70, preferably using a fastener 50. With the heating device 18 enclosed within the heating device chamber 72, the user of the warming wrap 36 takes the warming wrap 36 in its straight position and strikes the warming wrap 36 against a ski pole 12, other handheld device, or other devices in a preferred location on the device. The action of striking the warming wrap 36 against the ski pole 12 or other device will cause the warming wrap 36 to curl around the ski pole 12 or other device, ending up in a curled position. The user places his or her hands, other body part, or other device on the outer layer 14 portion of the warming wrap 36, which allows the heat from the heating device 18 portion to reach the user. An insulation layer 56 limits the escape of heat into the ski pole 12 or other device. A grip layer 58 limits the warming wrap 36 from slipping away from the user's desired placement of the warming warp 36 on the ski pole 12 or other device. To return the ski pole 12 to its natural state, the user removes the warming wrap 36 by uncurling the warming wrap 36. The user may store the warming wrap 36 in a flat or curled position. The user places the warming wrap 36 on other handheld devices, sporting equipment, outdoor equipment, tools, or indoor devices. One of ordinary skill in the art will understand that the heating device 18 placed in the heating device chamber 72 may come from electric heating devices 62 such as battery operated heating coils, defroster line heaters, and heating pads, and other devices that rely on electricity to produce heat or non-electric heating devices 64 such as mechanical, thermal, and chemical devices, including disposable hand warmers, toe warmers, foot warmers, body warmers, friction-producing devices, and other devices that do not rely on electricity to produce heat. The user may replace the heating device 18 with a new or different heating device 18 when the heating device 18 no longer produces sufficient heat.

The above are example principles of this disclosure. Many embodiments can be made using these principles.

What is claimed is:

1. A system adapted to connect to a mobile phone to maintain a battery power of the mobile phone in cold temperatures; the system comprising:
    (a) an outer layer configured to transfer heat;
    (b) a heating layer comprising a heating device chamber to receive a heating device;
    (c) a heating device positioned in the heating device chamber;
    (d) an insulation layer against the heating layer, the heating layer being between and against the outer layer and insulation layer wherein the outer layer, heating layer, and insulation layer are reversible to reverse a direction of heat transfer;
    (e) a fastener arrangement to removably fasten the system to a mobile phone.

2. The system of claim 1 further comprising an opening in the insulation layer to gain access to the heating device chamber wherein the opening in the insulation layer provides access to insert and remove a heating device.

3. The system of claim 2 further including a fastener positioned to close the opening of the insulation layer to secure the heating device within the heating device chamber of the heating layer.

4. The system of claim 1 wherein the fastener arrangement is an edge wrap.

5. The system of claim 4 wherein the edge wrap is an elastic fabric that stretches around the edges of the mobile phone.

6. The system of claim 4 wherein the edge wrap is a plastic material that snaps into place around the edges of the mobile phone.

7. The system of claim 1 wherein the heating device is a heat press with chemical reactant.

8. The system of claim 1 wherein the heating device is one or more of: a disposable hand warmer, a disposable toe warmer, a disposable foot warmer, a disposable body warmer.

9. The system of claim 1 wherein the outer layer, the heating layer, and the insulation layer are integrated.

10. The system of claim 1 wherein the insulation layer is one of water proof or water resistant.

11. The system of claim 1 wherein the insulation layer comprises a fabric that is capable of being printed upon using sublimation printing.

12. The system of claim 1 wherein the heating device is an electronic heating device.

13. The system of claim 1 wherein the heating device is a non-electronic heating device.

14. The system of claim 1 wherein the heating device is at least one of: removable from the system and replaceable in the system.

15. A method of maintaining the warmth of a mobile phone, comprising the steps of:
    (a) positioning a warming wrap around a mobile phone, the warming wrap having at least an outer layer configured to transfer heat, a heating layer, an insulation layer, a heating device to provide heat from the heating layer, and a fastener arrangement, wherein the outer layer, heating layer, and insulation layer are reversible to reverse a direction of heat transfer;
    (b) fastening the warming wrap using the fastener arrangement to the mobile phone; and
    (c) placing the heating device into the heating layer, wherein the warming wrap is configurable to transmit heat through the outer layer to the mobile phone or through the outer layer to a user.

16. The method of claim 15 wherein the step of using the fastener arrangement includes using an edge wrap.

17. The method of claim 16 wherein the edge wrap consists of elastic fabric.

18. The method of claim 16 wherein the edge wrap consists of plastic that snaps into place around the edge of a mobile phone.

19. The method of claim 15 further comprising a step of inserting the heating device into a heating device chamber within the heating layer.

20. A mobile phone including a warming wrap, the warming wrap comprising:
    (a) a plurality of layers comprising:
        (i) an insulation layer;
        (ii) a heating layer; and
    (c) (iii) an outer layer configured to transfer heat, wherein the plurality of layers is reversible to reverse a direction of heat transfer;
    (b) a heating device; and (d) a fastener arrangement to fasten the warming wrap to the mobile phone.

21. The mobile phone of claim 20 wherein the fastener arrangement is removable.

22. The mobile phone of claim 20 wherein the heating device is removable and replaceable.

* * * * *